United States Patent
Bernt et al.

(10) Patent No.: US 12,412,810 B2
(45) Date of Patent: Sep. 9, 2025

(54) SINGLE SIDE VIA FILL PROCESS FOR THROUGH-VIAS

(71) Applicant: Applied Materials, Inc., Santa Clara, CA (US)

(72) Inventors: Marvin Louis Bernt, Whitefish, MT (US); Jon Woodyard, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 646 days.

(21) Appl. No.: 17/705,239

(22) Filed: Mar. 25, 2022

(65) Prior Publication Data

US 2023/0307320 A1   Sep. 28, 2023

(51) Int. Cl.
*H01L 23/48*   (2006.01)
*H01L 21/768*   (2006.01)
*H01L 23/532*   (2006.01)

(52) U.S. Cl.
CPC ...... *H01L 23/481* (2013.01); *H01L 21/76877* (2013.01); *H01L 21/76898* (2013.01); *H01L 23/53238* (2013.01)

(58) Field of Classification Search
CPC . H01L 23/481; H01L 23/53238; H01L 24/16; H01L 21/6835; H01L 21/76877; H01L 21/76898; H01L 21/486; H01L 25/50
See application file for complete search history.

(56) References Cited

U.S. PATENT DOCUMENTS

| | | | |
|---|---|---|---|
| 6,429,509 B1 * | 8/2002 | Hsuan | H01L 23/481 |
| | | | 257/621 |
| 7,178,233 B2 | 2/2007 | Nakamura et al. | |
| 7,850,836 B2 * | 12/2010 | Dixit | C25D 5/617 |
| | | | 205/125 |
| 9,583,365 B2 | 2/2017 | Yu et al. | |
| 9,668,352 B2 | 5/2017 | Wang et al. | |
| 10,290,672 B2 | 5/2019 | Kinsman et al. | |
| 10,653,010 B1 | 5/2020 | Liu et al. | |
| 10,917,966 B2 | 2/2021 | Jayaraman | |
| 11,049,798 B2 | 6/2021 | Vaidya et al. | |
| 12,004,295 B2 * | 6/2024 | Jayaraman | H05K 1/09 |
| 2013/0313121 A1 * | 11/2013 | Yu | H01L 23/49827 |
| | | | 205/122 |
| 2016/0113119 A1 | 4/2016 | Cordes et al. | |
| 2020/0066441 A1 * | 2/2020 | Furukawa | H01F 5/003 |

OTHER PUBLICATIONS

PCT International Search Report and Written Opinion for PCT/US2023/015828 dated Jul. 12, 2023.

\* cited by examiner

*Primary Examiner* — Zandra V Smith
*Assistant Examiner* — John M Parker
(74) *Attorney, Agent, or Firm* — Moser Taboada

(57) ABSTRACT

Methods and apparatus for single side filling of through-vias in a substrate are provided herein. In some embodiments, a method of filling through-vias in a substrate includes: coupling a first side of the substrate having through-vias to a carrier plate with an adhesive layer; exposing the through-vias to a conductive layer disposed between the carrier plate and the first side of the substrate; and plating the substrate using the conductive layer as a conductive seed layer to fill the through-vias with a conductive material.

17 Claims, 5 Drawing Sheets

SINGLE SIDE VIA FILL PROCESS FOR THROUGH-VIAS

FIELD

Embodiments of the present disclosure generally relate to semiconductor substrate processing.

BACKGROUND

In semiconductor packaging, one or more layers of dies are typically stacked on a substrate to form integrated circuits. The various circuit elements are connected through conductive connectors to form a complete circuit, which can contain millions of individual circuit elements. Interconnects provide the electrical connections between the various circuit elements and a device's external contact elements such as pins for connecting the integrated circuit to other circuits. Interconnects are typically formed through metal filled through-vias of substrates. Copper is often used as a metal fill for vias. However, copper problematically diffuses into the surroundings unless contained, for example, in a liner. However, conventional through-via filling process flow requires complex deposition of liner layers, seed layers, and planarization of collateral field deposition.

Accordingly, the inventors have provided herein improved methods and apparatus for filling through-vias in a substrate.

SUMMARY

Methods and apparatus for single side filling of through-vias in a substrate are provided herein. In some embodiments, a method of filling through-vias in a substrate includes: coupling a first side of the substrate having through-vias to a carrier plate with an adhesive layer; exposing the through-vias to a conductive layer disposed between the carrier plate and the first side of the substrate; and plating the substrate using the conductive layer as a conductive seed layer to fill the through-vias with a conductive material.

In some embodiments, a method of filling through-vias in a substrate includes: coupling a first side of the substrate having through-vias to a carrier plate with an adhesive layer; exposing the through-vias to a conductive layer disposed between the carrier plate and the first side of the substrate; plating the substrate using the conductive layer as a conductive seed layer to fill the through-vias with a conductive material; detaching the carrier plate from the substrate; and covering an upper surface of the substrate with an upper polymer layer and covering a lower surface of the substrate with a lower polymer layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
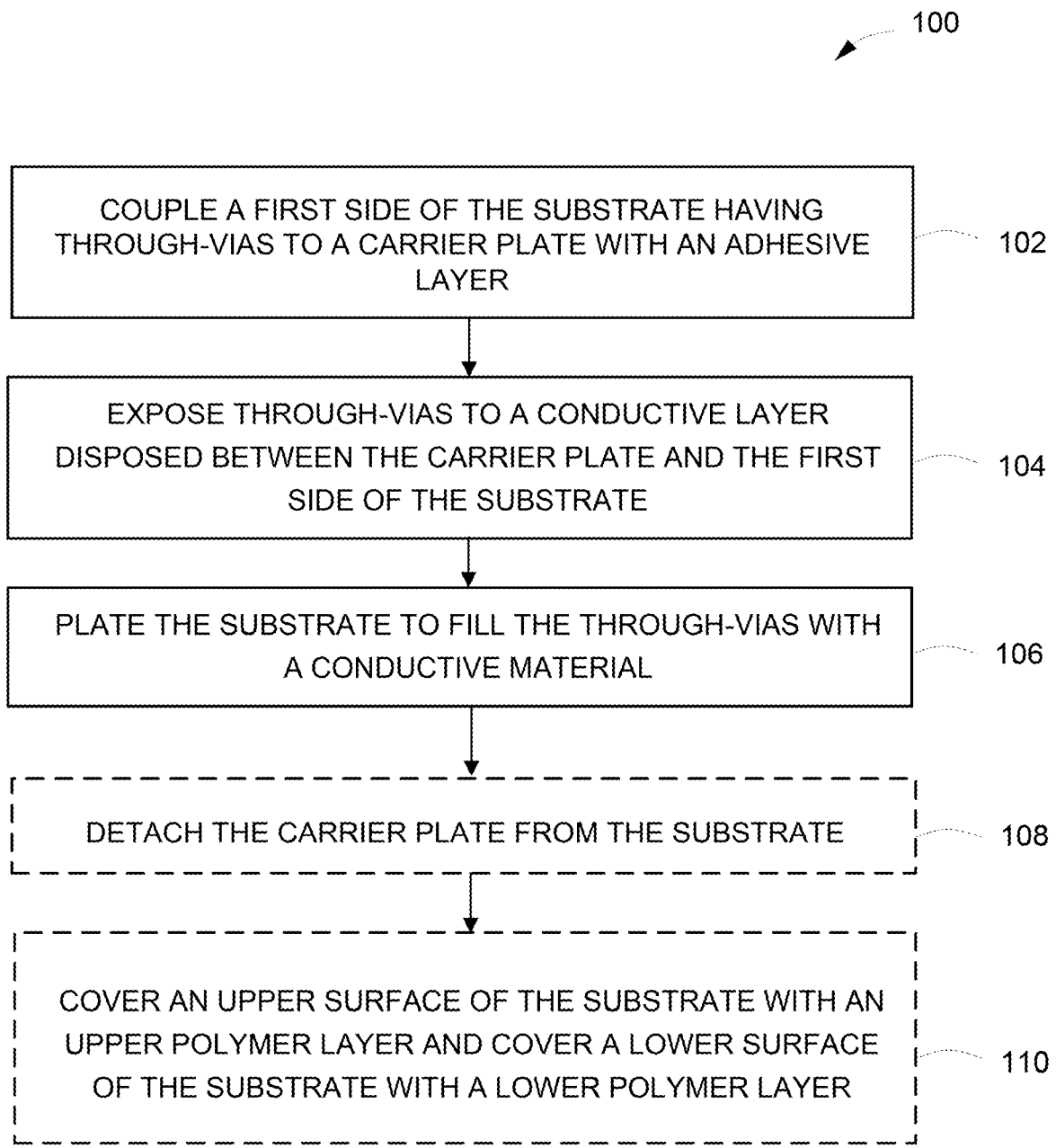
FIG. 1 depicts a flow chart of a method of filling through-vias in a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for single side filling of through-vias in a substrate are provided herein. The methods and apparatus described herein provide an alternative to conventional through-silicon via (TSV) like fill processes which comprise deposition of conformal PVD seed layers prior to a fill process. The methods described herein generally include exposing the through-vias to a temporary bottom seed layer to facilitate filling the through-vias by a plating process to advantageously overcome many of the costs and complexities of filling of blind through-vias using specialty chemicals and complex deposition and etch processes followed by chemical-mechanical polishing (CMP) of collateral field deposition. The methods provided herein also advantageously facilitate faster fill than dual side approaches and with less propensity for voids in the through-vias.

FIG. 1 depicts a flow chart of a method of filling through-vias in a substrate in accordance with at least some embodiments of the present disclosure. The substrate (e.g., substrate 220) may be any suitable type of substrate, such as an interposer or advanced substrate (e.g., active substrate with embedded features). The substrate may be made of silicon, glass, or other suitable material. The method 100 at 102 includes coupling a first side (e.g., first side 208) of the substrate having through-vias (e.g., through-vias 240) to a carrier plate (e.g., carrier plate 210) with an adhesive layer (e.g., adhesive layer 230). In some embodiments, the substrate is about 200 to about 500 microns thick. In some embodiments, the through-vias have a diameter of about 20 to about 120 microns. In some embodiments, the through-vias have a diameter of about 20 to about 60 microns. In some embodiments, the substrate is rectangular shaped and has sides that are about 0.4 to about 0.6 meters.

Figure 2A:
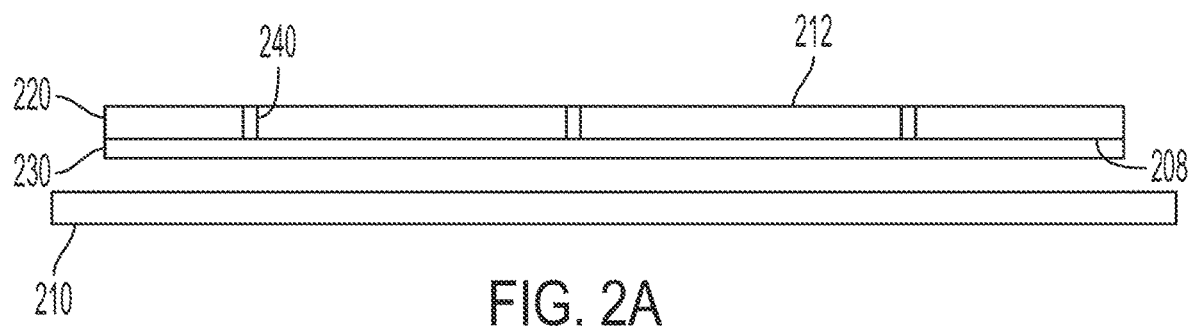
FIG. 2A depicts a schematic cross-sectional view of a substrate that is uncoupled to a carrier plate in accordance with at least some embodiments of the present disclosure.

FIG. 2A depicts a schematic cross-sectional view of a substrate 220 that is uncoupled to a carrier plate 210 in accordance with at least some embodiments of the present disclosure. The substrate 220 includes a plurality of through-vias 240 disposed through the substrate 220 and extending from the first side 208 to a second side 212 opposite the first side 208. In some embodiments, as depicted in FIG. 2A, an adhesive layer 230 is disposed on or applied to a first side 208 of the substrate 220. In some embodiments, the adhesive layer 230 may be disposed on or applied to the carrier plate 210. In some embodiments, the adhesive layer 230 is applied as a film or as a liquid via spin coating or spray coating. In some embodiments the adhesive layer 230 is a temporary layer. In some embodiments, if the adhesive layer 230 is applied as a liquid, the liquid may be partially cured to reduce splatter or contamination. The adhesive layer 230 may be suitably thick enough to sufficiently couple the substrate 220 to the carrier plate 210 while thin enough to facilitate easy removal. In some embodiments, the adhesive layer 230 is about 2 to about 100 microns thick, for example, about 2 to about 50 microns thick or about 2 to about 5 microns thick.

Figure 2B:
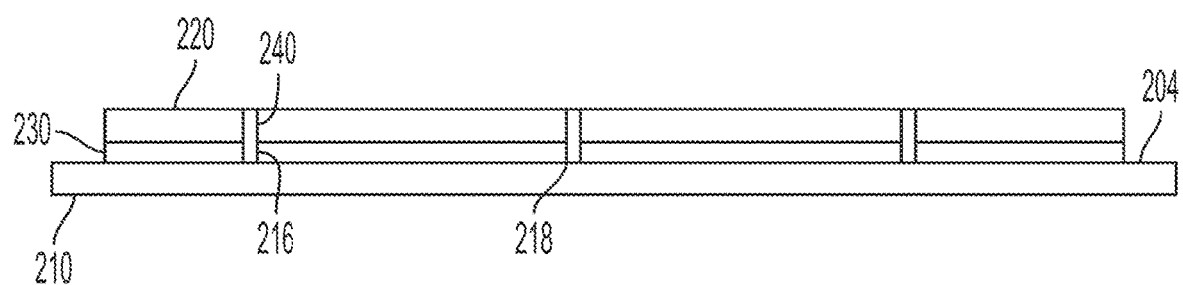
FIG. 2B depicts a schematic cross-sectional view of the substrate of FIG. 2A coupled to the carrier plate in accordance with at least some embodiments of the present disclosure.

FIG. 2B depicts a schematic cross-sectional view of the substrate 220 of FIG. 2A coupled to the carrier plate 210 in accordance with at least some embodiments of the present disclosure. The carrier plate 210 generally covers ends 218 of the plurality of through-vias 240 on the first side 208 of the substrate 220. In some embodiments, the carrier plate 210 comprises a conductive layer 204 formed on an upper surface of the carrier plate 210 and adjacent the adhesive layer 230. In some embodiments, the conductive layer 204 forms a conductive seed layer about 1000 to about 5000 angstroms thick. In some embodiments, the conductive layer 204 comprises a copper layer. In some embodiments, the carrier plate 210 comprises the conductive layer 204, such as a copper layer, disposed on a glass or stainless-steel core or sublayer. In some embodiments the carrier plate 210 is a solid plate with no through holes.

The method 100 at 104 includes exposing the through-vias to a conductive layer disposed between the carrier plate and the first side of the substrate. In some embodiments, as depicted in FIGS. 2A and 2B, the adhesive layer 230 is a non-conductive adhesive layer. In such embodiments, the method 100 includes forming through-holes 216 in the adhesive layer 230 at locations corresponding to or aligned with the through-vias 240 so that the conductive layer 204 of the carrier plate 210 is exposed to the through-vias 240. The drilling may comprise mechanical drilling, laser drilling, or the like.

Figure 3:
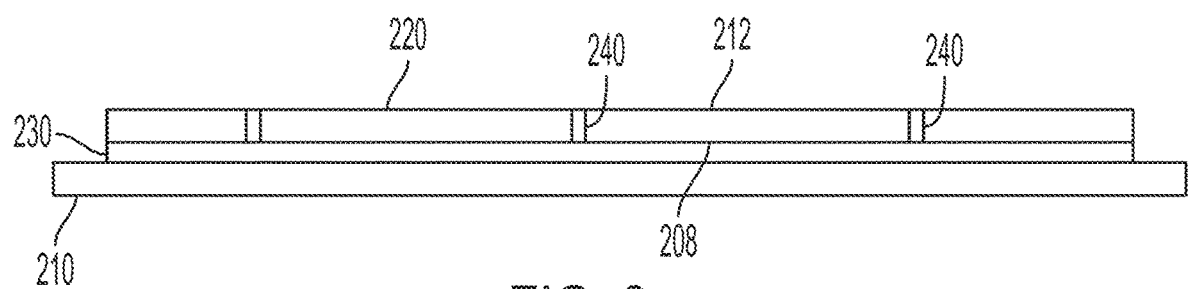
FIG. 3 depicts a schematic cross-sectional view of a substrate coupled to a carrier plate in accordance with at least some embodiments of the present disclosure.

FIG. 3 depicts a schematic cross-sectional view of a substrate 220 coupled to a carrier plate 210 in accordance with at least some embodiments of the present disclosure. In some embodiments, as shown in FIG. 3, the adhesive layer 230 is a conductive adhesive layer that forms a conductive seed layer. In such embodiments, the adhesive layer 230 does not need to be etched to expose the through vias 240 as the conductive adhesive layer suffices to facilitate a subsequent plating processing thereon. In some embodiments, the conductive adhesive layer has a sheet resistance value of about 86 to about 3400 meter ohms per square (m*ohm/sq). In some embodiments, where the carrier plate 210 includes the conductive layer 204, the conductive adhesive layer has a sheet resistance value of about 860 to about 3400 m*ohm/sq. In some embodiments, where the carrier plate 210 does not include a conductive layer 204 and the conductive adhesive layer forms the conductive seed layer, the conductive adhesive layer has a sheet resistance value of about 86 to about 344 m*ohm/sq.

Figure 6A:
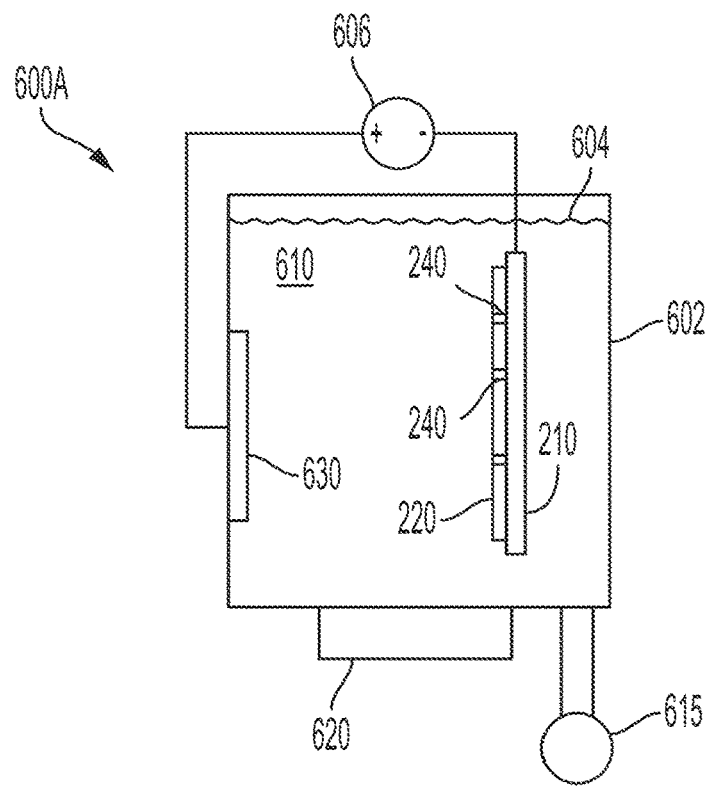
FIG. 6A depicts a single substrate plating apparatus in accordance with at least some embodiments of the present disclosure.
Figure 6B:
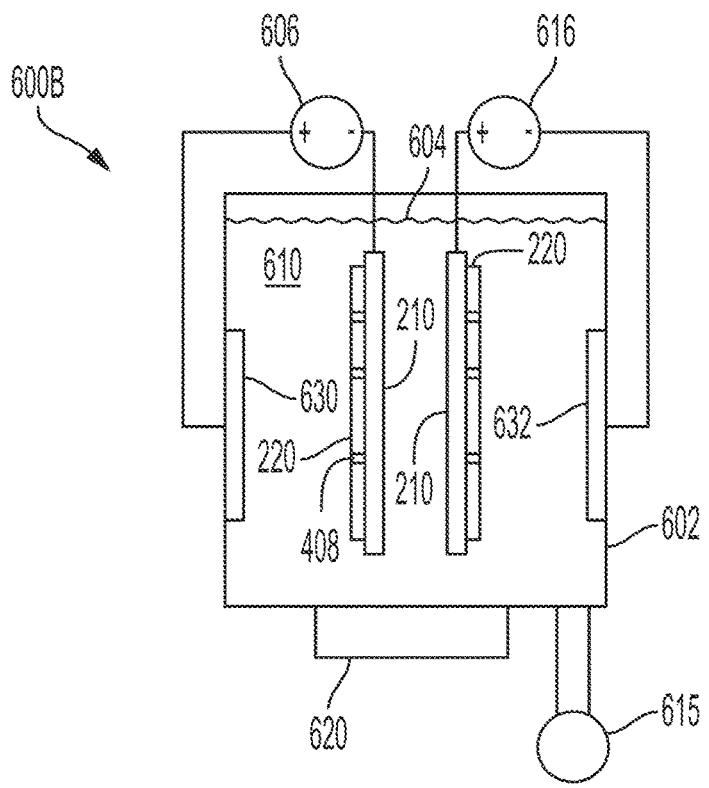
FIG. 6B depicts a dual substrate plating apparatus in accordance with at least some embodiments of the present disclosure.

Referring back to FIG. 1, the method 100 at 106 includes plating the substrate using the conductive layer as a conductive seed layer (e.g., conductive layer 204, conductive adhesive layer, foil layer 520) to fill the through-vias with a conductive material (e.g., conductive material 408). In some embodiments, plating the substrate to fill the through-vias is advantageously performed without any intervening deposition process in the through-vias, for example, without any PVD or CVD process. Plating the substrate may be performed via any suitable horizontal or vertical plating process. For example, FIG. 6A depicts a schematic view of a single substrate plating apparatus 600A in accordance with at least some embodiments of the present disclosure and FIG. 6B depicts a schematic view of a dual substrate plating apparatus 600B in accordance with at least some embodiments of the present disclosure. Both the single substrate plating apparatus 600A and the dual substrate plating apparatus 600B generally include a chamber body 602 defining an interior volume 610 therein.

The interior volume 610 includes a liquid bath 604 having metal ions of a suitable composition for electroplating. The liquid bath 604 is filled high enough to submerge the carrier plate 210 coupled to the substrate 220. The chamber body 602 is coupled to a pump 615 configured to regulate and replenish the flow of the liquid bath 604 in the interior volume 610. A heater 620 may be coupled to the chamber body 602 to control a temperature of the plating process. For the single substrate plating apparatus 600A, a first power supply 606 is coupled on one side to an anode 630 disposed in the interior volume 610 and on another side to the carrier plate 210. The conductive seed layer of the carrier plate 210 attracts the metal ions in the liquid bath 604, for example copper ions, thereby filling the through-vias 240 of the substrate 220 with metal.

For the dual substrate plating apparatus 600B, a first power supply 606 is coupled on one side to an anode 630 disposed in the interior volume 610 and on another side to a first one of the carrier plate 210. A second power supply 616 is coupled on one side to a second anode 632 disposed in the interior volume 610 and on another side to a second one of the carrier plate 210. The conductive seed layers of the two carrier plates 210 attract the metal ions in the liquid bath 604, for example copper ions, thereby filling the through-vias 240 of the substrates 220 with metal.

Referring back to FIG. 1, the method 100 at 108 optionally includes detaching the carrier plate from the substrate. In some embodiments, detaching the carrier plate from the substrate by applying heat to the adhesive layer after plating the substrate. The method 100 at 110 optionally includes covering an upper surface of the substrate with an upper film layer (e.g., upper film layer 420) and covering a lower surface of the substrate with a lower film layer (e.g., lower film layer 410). In some embodiments, the upper film layer and the lower film layer has a thickness of about 10 to about 50 micrometers. The upper film layer and the lower film layer may serve to at least one of passivate or planarize the substrate. In some embodiments, the method 100 includes drilling holes (e.g., holes 418) through the upper film layer and the drilling holes (e.g., holes 422) through the lower film layer to expose the conductive material in the through-vias. In some embodiments, covering the upper surface and the lower surface of the substrate comprises applying a liquid polymer to the upper surface, that when cured, forms the upper film layer, and applying the liquid polymer to the lower surface, that when cured, forms the lower film layer. The upper film layer may generally comprise an upper polymer layer. The lower film layer may generally comprise a lower polymer layer. In some embodiments, the upper film layer and the lower film layer comprise Ajinomoto Build-up Film (ABF)® commercially available from and a registered trademark of Ajinomoto Co., Inc. located in Tokyo, Japan.

Figure 4:
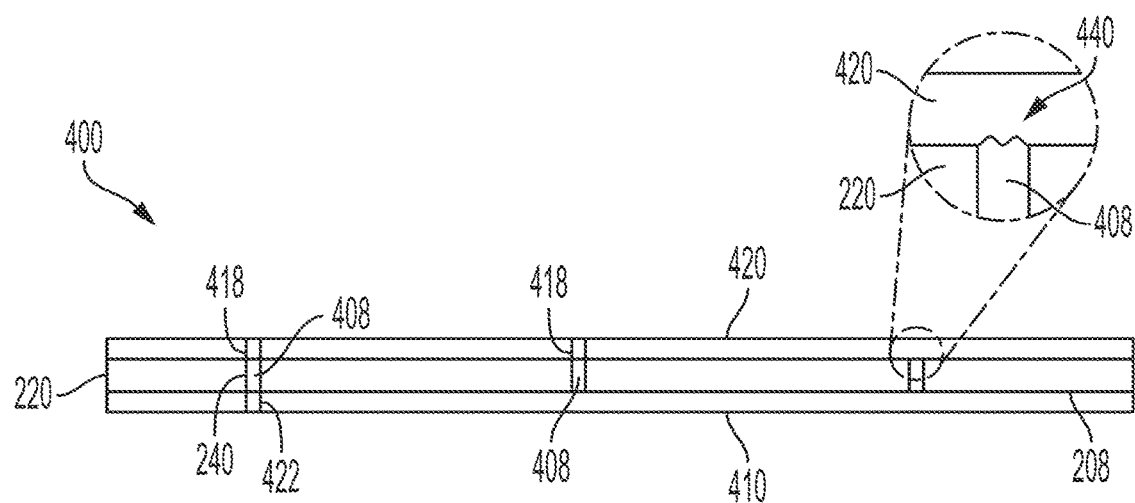
FIG. 4 depicts a schematic cross-sectional view of a substrate with filled through-vias and covered with film layers in accordance with at least some embodiments of the present disclosure.

FIG. 4 depicts a schematic cross-sectional view of a device 400 comprising a substrate 220 with filled through-vias and covered with film layers in accordance with at least some embodiments of the present disclosure. The through-vias 240 are filed with a conductive material 408. In some embodiments, the film layers may comprise an upper film layer 420 disposed on the second side 212, or upper surface, of the substrate 220. In some embodiments, a lower film layer 410 is disposed on the first side 208, or lower surface, of the substrate 220. During the plating process, the conductive material 408 may be overfilled 440 or underfilled. The lower film layer 410 and the upper film layer 420 may compensate for the through-vias 240 that are overfilled 440 or through-vias 240 that are underfilled and advantageously form a generally flat planar surface for subsequent processing without costly or messy CMP processes.

The upper film layer 420 may include one or more holes 418 aligned with one or more of the plurality of through-vias 240 to expose the conductive material 408 to form metal interconnects for subsequent layers. The lower film layer 410 may include one or more holes 422 aligned with one or more of the plurality of through-vias 240 to expose the conductive material 408 to form metal interconnects for subsequent layers. The one or more holes 418 and the one or more holes 422 may be formed via any suitable method, for example, formed via laser ablation, plasma etching with hard mask, or mechanical drilling. In some embodiments, the upper film layer 420 and the lower film layer 410 may be laminated in plate with heat and vacuum after forming the one or more holes 418 and the one or more holes 422.

Figure 5:
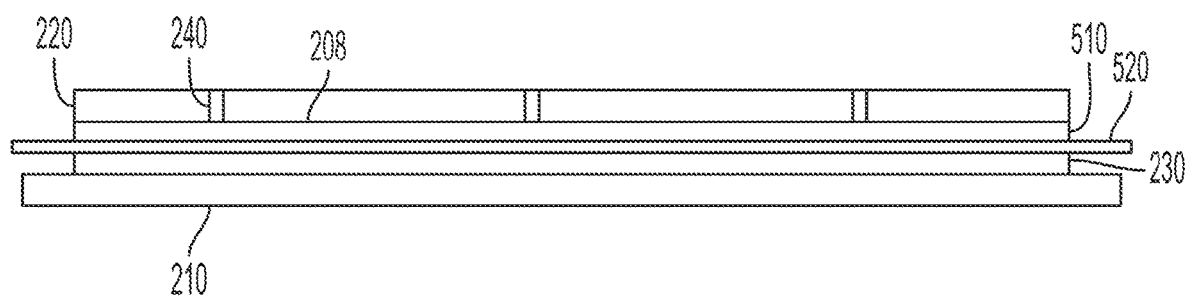
FIG. 5 depicts a schematic cross-sectional view of a substrate coupled to a carrier plate in accordance with at least some embodiments of the present disclosure.

FIG. 5 depicts a schematic cross-sectional view of a substrate 220 coupled to a carrier plate 210 in accordance with at least some embodiments of the present disclosure. In some embodiments, the adhesive layer 230 is a temporary adhesive layer applied to the carrier plate 210. In some embodiments, the temporary adhesive layer comprises a non-conductive adhesive. In some embodiments, a second adhesive layer 510 is coupled to the first side 208 of the substrate 220. The second adhesive layer 510 may comprise a permanent adhesive layer. In some embodiments, the second adhesive layer 510 is a conductive layer. The second adhesive layer 510 is generally thinner than the adhesive layer 230. A foil layer 520 may be coupled between the adhesive layer 230 and the second adhesive layer 510. In some embodiments, the foil layer 520 is a copper foil layer. The foil layer 520 may provide the conductive layer used as the conductive seed layer for filling the through-vias 240 with a plating process.

Returning back to FIG. 1, in some embodiments, prior to plating the substrate to fill the through-vias, the method 100 includes applying a temporary adhesive layer (e.g., adhesive layer 230) to the carrier plate and applying a second adhesive layer (e.g., second adhesive layer 510) to the substrate. In some embodiments, the method 100 includes coupling a foil layer (e.g., foil layer 520) to the second adhesive layer on a side of the second adhesive opposite the substrate and attaching the foil layer to the temporary adhesive layer applied to the carrier plate. In some embodiments, after plating the substrate to fill the through-vias, the temporary adhesive layer is detached from the foil layer. In some embodiments, after plating the substrate to fill the through-vias, the foil layer and the second adhesive layer are removed. In some embodiments, the foil layer is removed via an etch process. In some embodiments, the second adhesive layer is removed via a solvent clean process. In some embodiments, the method 100 includes forming a redistribution layer on the substrate configured to route electrical connections from the plurality of through-vias 240 filled with the conductive material 408 to other device components.

The term about used herein may comprise within 10 percent of the value specified. While the foregoing is directed to embodiments of the present disclosure, other and further embodiments of the disclosure may be devised without departing from the basic scope thereof.

The invention claimed is:

1. A method of filling through-vias in a substrate, comprising:
   coupling a first side of the substrate having through-vias to a carrier plate with an adhesive layer;
   exposing the through-vias to a conductive layer disposed between the carrier plate and the first side of the substrate; and
   plating the substrate using the conductive layer as a conductive seed layer to fill the through-vias with a conductive material; and at least one of:
   further comprising detaching the carrier plate from the substrate by applying heat to the adhesive layer after plating the substrate and covering an upper surface of the substrate with an upper polymer layer and covering a lower surface of the substrate with a lower polymer layer to passivate and planarize the substrate; or
   wherein the adhesive layer is a conductive adhesive layer used as the conductive seed layer.

2. The method of claim 1, wherein the conductive layer is a layer formed on an upper surface of the carrier plate.

3. The method of claim 2, wherein the adhesive layer is a non-conductive adhesive layer, and further comprising:
   etching the adhesive layer at locations corresponding to the through-vias so that the conductive layer formed on the carrier plate is exposed to the through-vias.

4. The method of claim 1, further comprising forming holes through the upper polymer layer and the lower polymer layer via laser ablation, plasma etching, or mechanical drilling to expose the conductive material in the through-vias.

5. The method of claim 1, wherein the conductive layer is about 1000 to about 5000 angstroms thick.

6. The method of claim 1, wherein the adhesive layer is a temporary adhesive layer applied to the carrier plate and further comprising:
   applying a second adhesive layer to the substrate;
   coupling a foil layer to the second adhesive layer on a side of the second adhesive layer opposite the substrate, wherein the foil layer forms the conductive layer; and
   attaching the foil layer to the temporary adhesive applied to the carrier plate.

7. A method of filling through-vias in a substrate, comprising:
   coupling a first side of the substrate having through-vias to a carrier plate with an adhesive layer;
   exposing the through-vias to a conductive layer disposed between the carrier plate and the first side of the substrate; and
   plating the substrate using the conductive layer as a conductive seed layer to fill the through-vias with a conductive material;

wherein the adhesive layer is a temporary adhesive layer applied to the carrier plate and further comprising:
  applying a second adhesive layer to the substrate, wherein the second adhesive layer is a permanent adhesive;
  coupling a foil layer to the second adhesive layer on a side of the second adhesive layer opposite the substrate, wherein the foil layer forms the conductive layer;
  attaching the foil layer to the temporary adhesive layer applied to the carrier plate;
  detaching the temporary adhesive layer from the foil layer; and
  performing an etch process to remove the foil layer and the second adhesive layer.

8. A method of filling through-vias in a substrate, comprising:
  coupling a first side of the substrate having through-vias to a carrier plate with an adhesive layer;
  exposing the through-vias to a conductive layer disposed between the carrier plate and the first side of the substrate;
  plating the substrate using the conductive layer as a conductive seed layer to fill the through-vias with a conductive material;
  detaching the carrier plate from the substrate; and
  covering an upper surface of the substrate with an upper polymer layer and covering a lower surface of the substrate with a lower polymer layer.

9. The method of claim 8, wherein at least one of:
  the adhesive layer is a conductive adhesive layer that forms the conductive layer, or
  wherein the conductive layer is a layer formed on an upper surface of the carrier plate, and wherein the adhesive layer is a non-conductive adhesive layer, and further comprising:
    etching the adhesive layer at locations corresponding to the through-vias so that the conductive layer formed on the carrier plate is exposed to the through-vias.

10. The method of claim 8, wherein the substrate is about 200 to about 500 microns thick and the adhesive layer is about 2 to about 100 microns thick.

11. The method of claim 8, wherein plating the substrate is performed without any intervening deposition process in the through-vias.

12. The method of claim 8, wherein the carrier plate comprises a copper layer disposed on a glass or stainless-steel core.

13. The method of claim 8, wherein the through-vias have a diameter of about 20 to about 120 microns.

14. The method of claim 8, wherein covering the upper surface and the lower surface of the substrate comprises applying a liquid polymer to the upper surface, that when cured, forms the upper polymer layer, and applying the liquid polymer to the lower surface, that when cured, forms the lower polymer layer.

15. The method of claim 8, wherein the carrier plate does not include a conductive layer and the adhesive layer comprises a conductive adhesive layer having a sheet resistance value of about 86 to about 344 meter ohms per square (m*ohm/sq).

16. The method of claim 8, wherein the substrate is made of glass or silicon.

17. The method of claim 8, wherein the conductive material is copper.

* * * * *